(12) United States Patent
Lakdawala et al.

(10) Patent No.: US 11,038,493 B1
(45) Date of Patent: Jun. 15, 2021

(54) LOCAL OSCILLATOR (LO) FOR WIRELESS COMMUNICATION

(71) Applicant: QUALCOMM Incorporated, San Diego, CA (US)

(72) Inventors: Hasnain Lakdawala, San Diego, CA (US); Joung Won Park, San Diego, CA (US); Tony Chang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/791,067

(22) Filed: Feb. 14, 2020

(51) Int. Cl.
*H03B 19/12* (2006.01)
*H03K 3/013* (2006.01)
*H03K 3/354* (2006.01)

(52) U.S. Cl.
CPC ............. *H03K 3/354* (2013.01); *H03B 19/12* (2013.01); *H03K 3/013* (2013.01)

(58) Field of Classification Search
CPC ........ H03B 19/00; H03B 19/12; H03B 21/00; H03B 21/01; H03B 21/02; H03B 21/025; H03B 21/04; H03B 2200/0074; H03B 2200/0088; H03B 2200/009; H03B 2202/044; H03B 2202/046; H03K 3/013; H03L 7/24; H04B 1/10; H04B 1/18; H04B 1/30
See application file for complete search history.

(56) References Cited

U.S. PATENT DOCUMENTS

| | | | | |
|---|---|---|---|---|
| 5,212,825 A | * | 5/1993 | Layton | H03D 1/2245 250/227.27 |
| 9,967,115 B1 | * | 5/2018 | Zhang | H03F 3/45201 |
| 10,158,387 B1 | * | 12/2018 | Sayilir | H03D 7/1466 |
| 2010/0120390 A1 | * | 5/2010 | Panikkath | H03B 27/00 455/208 |
| 2011/0124307 A1 | * | 5/2011 | Balankutty | H04B 1/12 455/296 |
| 2011/0148478 A1 | * | 6/2011 | Kang | H03D 7/1458 327/113 |

(Continued)

OTHER PUBLICATIONS

Mazzanti A., et al., "A Low Phase-Noise Multi-Phase LO Generator for Wideband Demodulators Based on Reconfigurable Sub-Harmonic Mixers", IEEE Journal of Solid-State Circuits, vol. 45, No. 10, Oct. 2010, pp. 2104-2115.

(Continued)

*Primary Examiner* — Levi Gannon
(74) *Attorney, Agent, or Firm* — Patterson + Sheridan, L.L.P.

(57) ABSTRACT

Certain aspects of the present disclosure provide a local oscillator (LO) for wireless communication. In some examples, the LO is configured to generate an LO signal by inverting, by a first inverter, a first signal to generate a second signal having a first frequency, the first signal being an oscillating signal. In some examples, the LO is configured to control, using a third signal having a second frequency, a first switch receiving the second signal. In some examples, the LO is configured to control, using a fourth signal having the second frequency, a second switch receiving the second signal, wherein the fourth signal is a complement of the third signal and wherein the second frequency is one-half the first frequency.

19 Claims, 7 Drawing Sheets

(56) References Cited

U.S. PATENT DOCUMENTS

| | | | | |
|---|---|---|---|---|
| 2014/0002159 A1* | 1/2014 | Chang | ............. | H03K 3/356191 |
| | | | | 327/198 |
| 2014/0018028 A1* | 1/2014 | Lemkin | .................. | H04B 1/18 |
| | | | | 455/269 |
| 2015/0372665 A1* | 12/2015 | Tohidian | .............. | H03B 5/1228 |
| | | | | 331/57 |
| 2017/0359092 A1* | 12/2017 | Dufrene | ............... | H04B 1/1027 |
| 2018/0138860 A1* | 5/2018 | Zhang | ...................... | H03K 7/08 |

OTHER PUBLICATIONS

Park J.W., et al., "Channel Selection at RF Using Miller Bandpass Filters", IEEE Journal of Solid-State Circuits, vol. 49, No. 12, Dec. 2014, pp. 3063-3078.

* cited by examiner

LOCAL OSCILLATOR (LO) FOR WIRELESS COMMUNICATION

TECHNICAL FIELD

Certain aspects of the present disclosure generally relate to electronic circuits and, more particularly, to a local oscillator (LO) circuit.

BACKGROUND

High performance wireless communication apparatus such as radio frequency (RF) receivers, transmitters, and transceivers typically include RF front-end circuitry that operates on an RF signal being received or transmitted. For example, the front-end circuitry may downconvert a received RF signal to baseband and/or upconvert a baseband signal for RF transmission.

The RF front-end circuitry typically includes analog circuits such as low noise amplifiers and mixers that have a relatively high sensitivity to noise and interference. The RF circuitry in some applications, such as in mobile communication cellular handsets, may be designed to detect signals as small as a few microvolts or less in amplitude, which can degrade noise figures (NFs) of the RF circuitry. Moreover, as transistor channel length shrinks, transistors become more prone to produce flicker noise in the RF circuitry. It is thus often important to minimize noise and/or interference from sources external or even internal to the communication apparatus.

SUMMARY

Certain aspects disclosed herein are directed to a local oscillator (LO) generation circuit. In some examples, the LO generation circuit includes a first oscillator circuit comprising a first inverter, a first switch having a first terminal coupled to an output of the first inverter and a first control input configured to receive a first control signal, and a second switch having a second terminal coupled to the output of the first inverter and a second control input configured to receive a second control signal, the second control signal being a complement of the first control signal.

Certain aspects disclosed herein are directed to a method for local oscillator (LO) generation. In some examples, the method includes inverting, by a first inverter, a first signal to generate a second signal having a first frequency, the first signal being an oscillating signal, controlling, using a third signal having a second frequency, a first switch receiving the second signal, and controlling, using a fourth signal having the second frequency, a second switch receiving the second signal, wherein the fourth signal is a complement of the third signal and wherein the second frequency is one-half the first frequency.

Certain aspects disclosed herein are directed to an apparatus for wireless communication. In some examples, the apparatus includes a means for inverting a first signal to generate a second signal having a first frequency, the first signal being an oscillating signal, means for controlling, using a third signal having a second frequency, a first switch receiving the second signal, and means for controlling, using a fourth signal having the second frequency, a second switch receiving the second signal, wherein the fourth signal is a complement of the third signal and wherein the second frequency is one-half the first frequency.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

Figure 1:
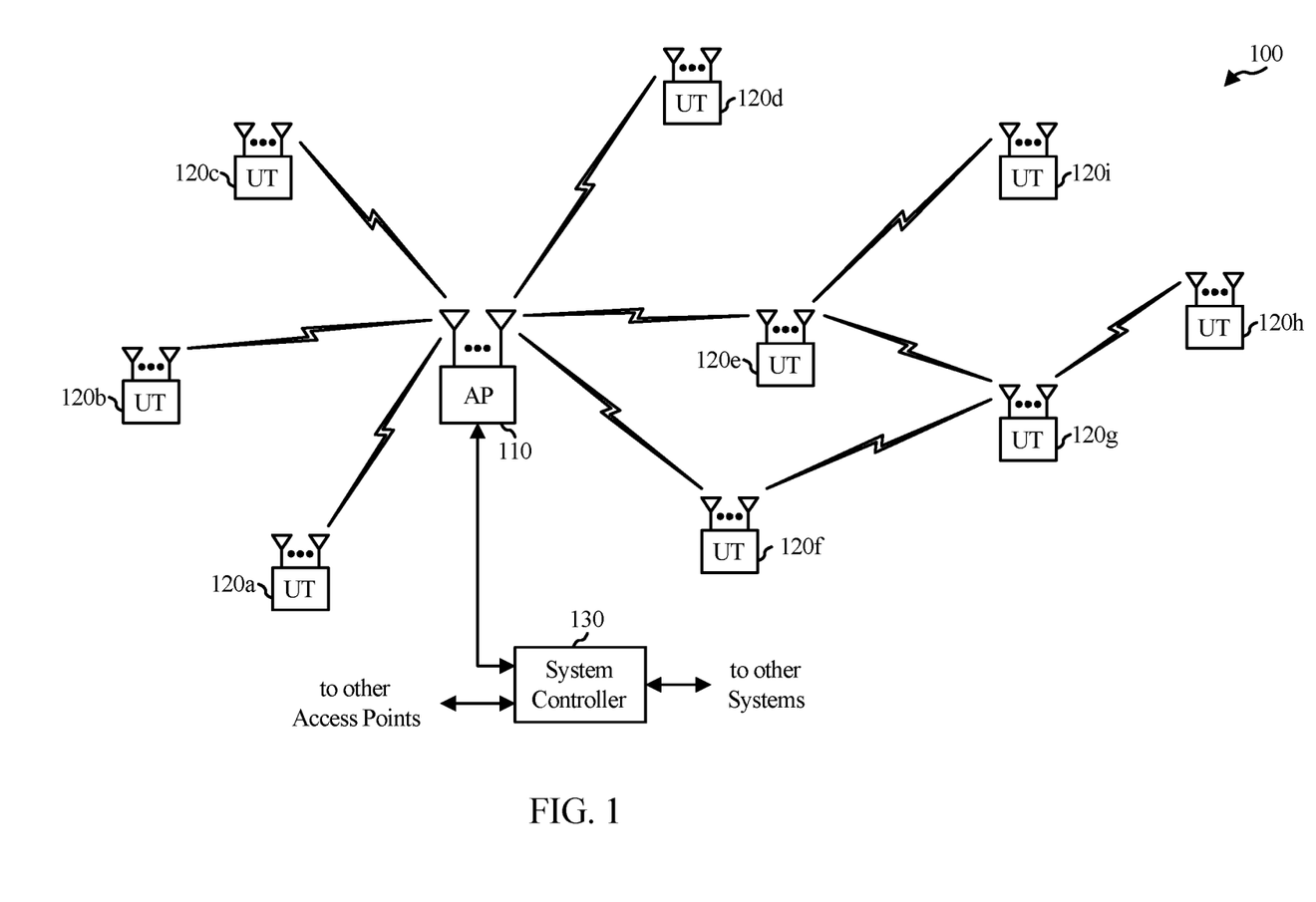
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., to keep costs down) or multiple antennas (e.g., where the additional cost can be supported). In certain aspects of the present disclosure, the access point 110 and/or user terminal 120 may include a local oscillator (LO) generation circuit, as described in more detail herein.

Figure 2:
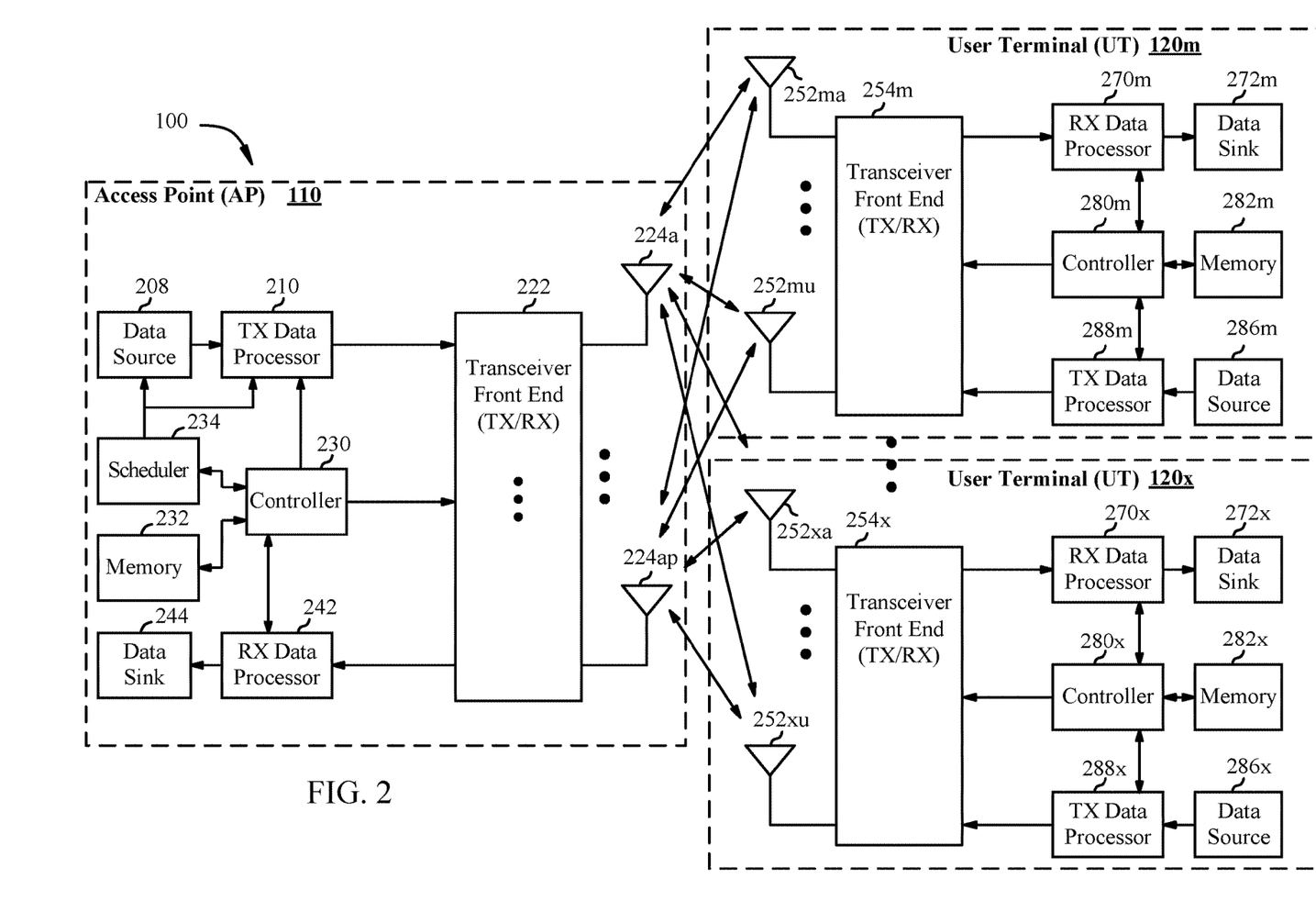
FIG. 2 is a block diagram of an example access point (AP) and example user terminals, in accordance with certain aspects of the present disclosure.

FIG. 2 shows a block diagram of access point 110 and two user terminals 120m and 120x in the wireless communications system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing. The transceiver front end (TX/RX) 222 of access point 110 and/or transceiver front end 254 of user terminal 120 may include a LO generation circuit, as described in more detail herein.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Figure 3:
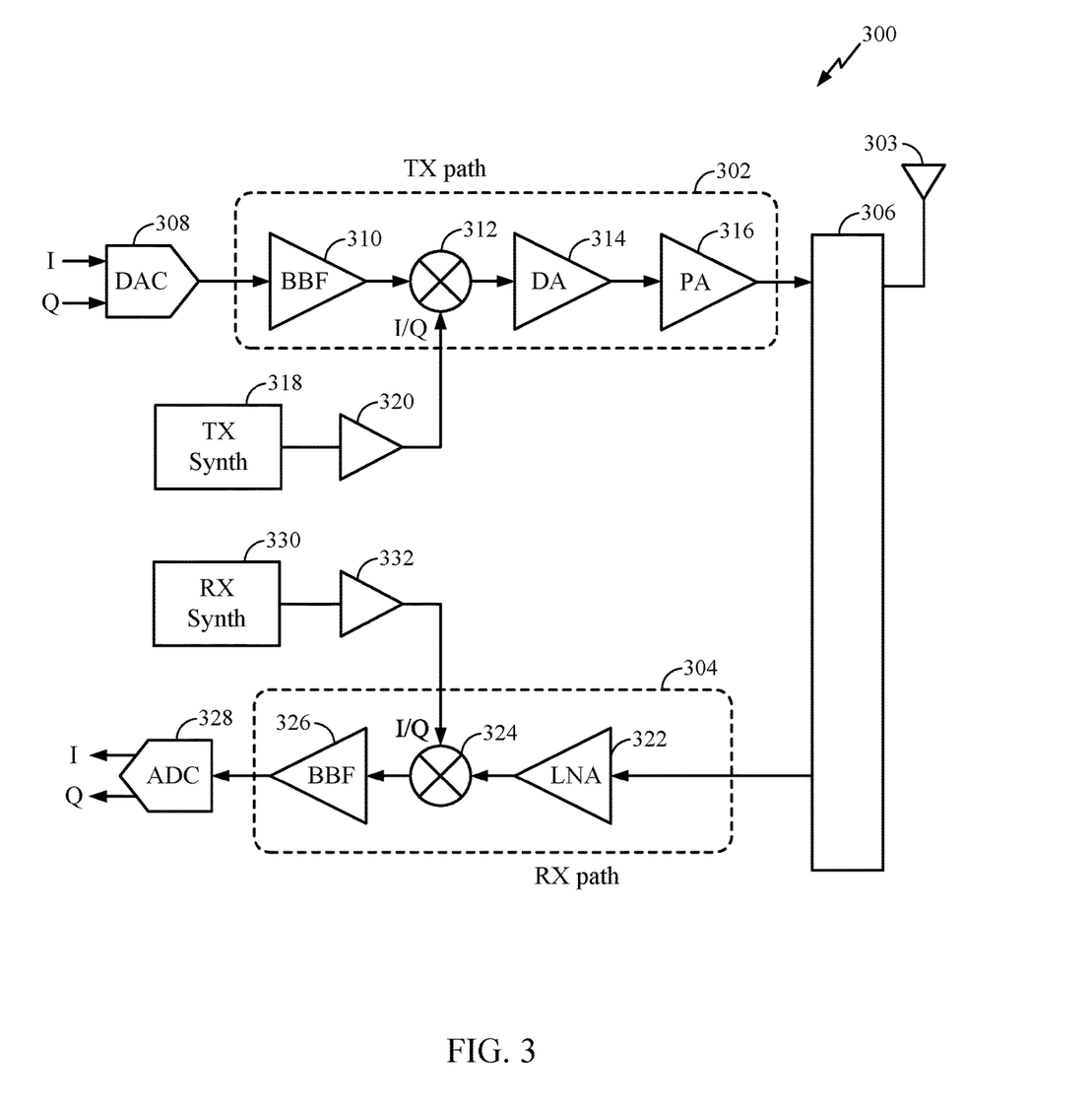
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning the LO to different frequencies typically entails using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

Example Local Oscillator Lo Circuit

Figure 4:
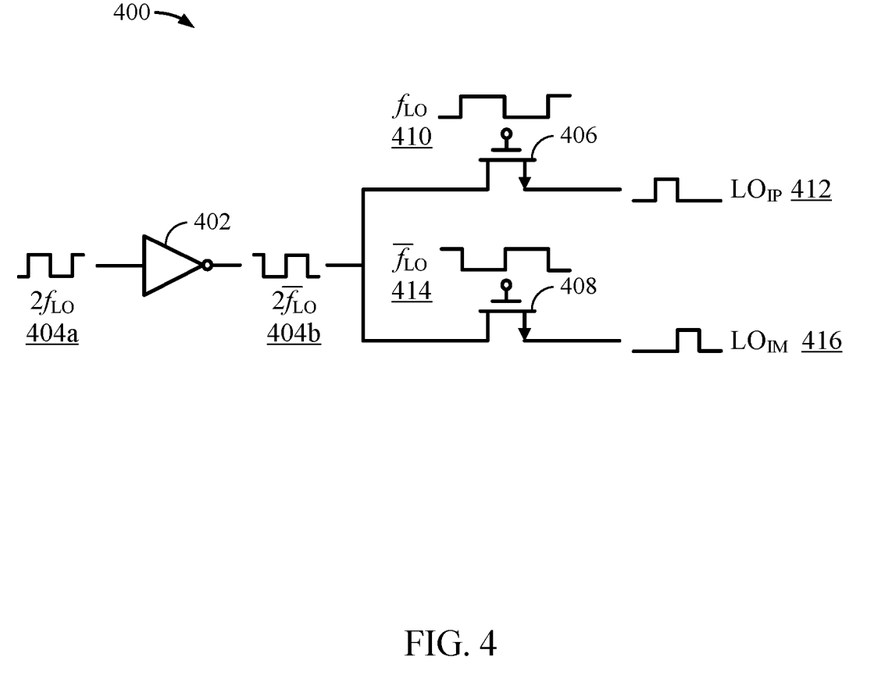
FIG. 4 is a circuit diagram of a first oscillating circuit, in accordance with certain aspects of the present disclosure.

Certain aspects of the present disclosure are generally directed to an LO circuit for a receiver (e.g., the LO circuit corresponding to RX frequency synthesizer 330 described with respect to FIG. 3). FIG. 4 is a circuit diagram of a first oscillating circuit 400 used in such an LO circuit, in accordance with certain aspects of the present disclosure.

The first oscillating circuit 400 includes a first inverter circuit 402 configured to output a voltage representing an opposite logic-level to its input. In some configurations, the first inverter circuit 402 inverts an input signal (e.g., generates another signal that is complementary to the input signal). For example, the first inverter circuit 402 may receive a first signal 404a having a frequency $2f_{LO}$, and output an inverted first signal 404b. The frequency $2f_{LO}$ is twice the frequency of the desired local oscillator (LO) frequency $f_{LO}$. In some configurations, the first inverter circuit 402 may be constructed using a single n-channel metal-oxide-semiconductor (NMOS) transistor or a single p-channel metal-oxide-semiconductor (PMOS) transistor coupled with a resistor. Alternatively, the first inverter circuit 402 may be constructed using two complementary transistors in a complementary metal-oxide-semiconductor (CMOS) configuration. It should be noted that this construction greatly reduces power consumption since one of the transistors is always off in both logic states. Processing speed can also be improved due to the relatively low resistance compared to the NMOS-only or PMOS-only type devices.

The first oscillating circuit 400 also includes a first switch 406 and a second switch 408 coupled to the output of the first inverter circuit 402. In some configurations, the first switch 406 includes a passive switch. Passive switches include, for example, one or more semiconductor diodes and/or resistors, while an active switch includes, for example, a metal-oxide-semiconductor field-effect transistor (MOSFET). In some examples, a passive switch is characterized by a switch state that is controlled by the voltage applied at one or more terminals of the switch. That is, the passive switch cannot directly provide energy to its terminals; it can only transfer energy provided by the first inverter circuit 402.

In some configurations, the first switch 406 includes a passive mixer. In the scope of the disclosure, passive mixers include, for example, one or more semiconductor diodes and/or resistors, while active mixers use an amplifying device to increase strength of the output signal. In some examples, the passive mixers are configured to output a signal which is the product of two input signals. For example, a passive mixer may use one or more diodes and rely on their non-linear relation between voltage and current to provide a multiplying element.

In some configurations, the first switch 406 is configured to receive, at a first terminal (e.g., a drain terminal), an inverted first signal 404b output from the first inverter circuit 402. The first switch 406 is also configured to receive, at a second terminal (e.g., a gate terminal) a divided signal 410 (e.g., with frequency $f_{LO}$). In some configurations, the divided signal 410 is a frequency-divided version of the first signal 404a. In some configurations, the divided signal 410 may include a frequency-divided (and phase-shifted) version of the inverted first signal 404b. Here, the first switch 406 is configured to clock, or gate, the inverted first signal 404b using the divided signal 410 to produce a first LO signal at a third terminal (e.g., a source terminal). In some configurations, the first LO signal 412 is generated by mixing, by the first switch 406, the inverted first signal 404b with the divided signal 410 to generate a version of the divided signal 410 having a 25% duty cycle.

The second switch 408 is substantially similar to the first switch 406, and is configured to receive, at a first terminal (e.g., a drain terminal), an inverted first signal 404b output from the first inverter circuit 402. The second switch 408 is also configured to receive, at a second terminal (e.g., a gate terminal) an inverted frequency-divided signal 414 (e.g., an inverted $f_{LO}$). In some configurations, the inverted divided signal 414 is a frequency-divided version of the first signal 404a. In some configurations, the frequency-divided signal 414 may include a frequency-divided version of the inverted first signal 404b. Here, the second switch 408 is configured to generate a second LO signal 416 at a fourth terminal (e.g., a source terminal). The second LO signal 416 is phase-shifted 180° from (e.g., is the complement of) the first LO signal 412. Thus, the first and second LO signals 412, 416 may be labeled $LO_{IP}$ and $LO_{IM}$ for plus and minus in-phase LO signals, respectively. Here, the second switch 408 is configured to clock, or gate, the inverted first signal 404b using the inverted divided signal 414 to produce the second LO signal 416 at the fourth terminal (e.g., the source terminal). Thus, in some configurations, the second LO signal 416 is generated by mixing, by the second switch 408, the inverted first signal 404b with the inverted frequency-divided signal 414 to generate a version of the inverted divided signal 414 having a 25% duty cycle.

Figure 5:
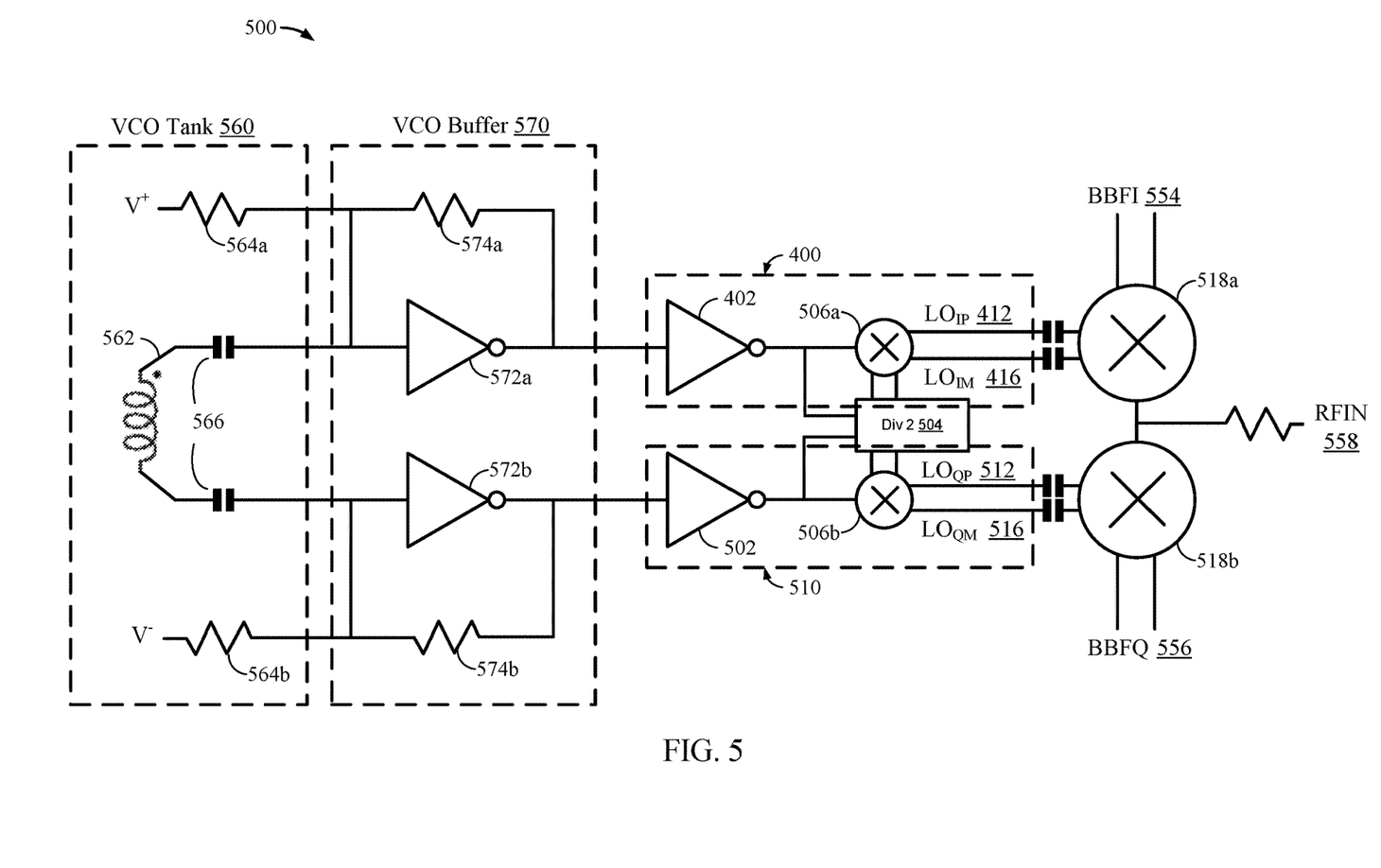
FIG. 5 is an example circuit diagram of the first oscillating circuit of FIG. 4 combined with a second oscillating circuit, in accordance with certain aspects of the present disclosure.

FIG. 5 is an example circuit diagram 500 of the first oscillating circuit 400 of FIG. 4 combined with a second oscillating circuit 510. The second oscillating circuit 510 may be substantially the same as the first oscillating circuit 400.

The circuit diagram 500 includes a voltage-controlled oscillator (VCO) tank 560 configured to provide a tunable oscillating signal. In some examples, the VCO tank 560 includes an electronic oscillator whose oscillation frequency is controlled by a voltage input (e.g., differential input signal pair V⁺ and V⁻). The applied input voltage determines the oscillation frequency. In some configurations, the VCO tank 560 includes a combination of an inductor 562 and capacitors 566. In some configurations, the VCO tank 560 is configured to output two signals. In some examples, the two signals may be complementary.

The circuit diagram 500 also includes a VCO buffer 570 coupled to the output of the VCO tank 560. The VCO buffer 570 includes a third inverter circuit 572a and a fourth inverter circuit 572b, each coupled to the VCO tank 560 and configured to receive one of the two signals produced by the VCO tank 560. The VCO buffer 570 provides a feedback resistor (574a and 574b) for each of the third inverter circuit 572a and fourth inverter circuit 572b to provide duty cycle control and ensure optimal self-leakage of signals produced by the VCO tank 560. In some configurations, the feedback resistors (574a and 574b) are coupled to respective voltage divider resistors (564a and 564b) to reduce voltage at the inverter circuits (572a and 572b).

The third inverter circuit 572a provides a first signal (e.g., the first signal 404a) to the first oscillating circuit 400. The fourth inverter circuit 572b provides a second signal to the second oscillating circuit 510. In some configurations, the first signal and the second signal are the inverse of each other, but are otherwise substantially similar.

The first oscillating circuit 400 includes the first inverter circuit 402 of FIG. 4 having an output coupled to a passive mixer 506a and a divider circuit 504. Accordingly, the first inverter circuit 402 provides an inverted version of the signal received from the VCO buffer 570 to the passive mixer 506a and the divider circuit 504. The passive mixer 506a may include a combination of the first switch 406 and the second switch 408 of FIG. 4. The passive mixer 506a outputs the first LO signal 412 and the second LO signal 416. Similarly, the second oscillating circuit 510 includes a second inverter circuit 502 coupled to another passive mixer 506b and the divider circuit 504. As such, the second inverter circuit 502 provides an inverted version of the signal received from the VCO buffer 570 to the other passive mixer 506b and the divider circuit 504. The other passive mixer 506b may include a combination of resistors and/or diodes similar to the configuration of the first switch 406 and the second switch 408 of FIG. 4. The other passive mixer 506b outputs a third LO signal 512 and a fourth LO signal 516. In some configurations, the first LO signal 412 and the second LO signal 416 include in-phase frequency signals, while the third LO signal 512 and the fourth LO signal 516 include quadrature frequency signals.

The circuit diagram 500 includes a first mixer 518a and a second mixer 518b configured to receive signals from the first oscillating circuit 400 and the second oscillating circuit 510, respectively, as well as in-phase baseband signals and quadrature baseband signals. For example, the first mixer 518a receives the first LO signal 412 and the second LO signal 416 from the first oscillating circuit 400, and mixes the LO signals with a differential baseband frequency in-phase (BBFI) 554 signal. The first mixer 518a then outputs a mixed (e.g., upconverted) signal to a radio-frequency (RF) circuit input 558. Similarly, the second mixer 518b receives the third LO signal 512 and the fourth LO signal 516 from the second oscillating circuit 510, and mixes the LO signals with a differential baseband frequency quadrature (BBFQ) 556 signal. The second mixer 518b then outputs a mixed (e.g., upconverted) signal to the RF circuit input 558. The first mixer 518a and the second mixer 518b may include one or more of a passive and/or active switch, or a passive and/or active mixer.

Figure 6:
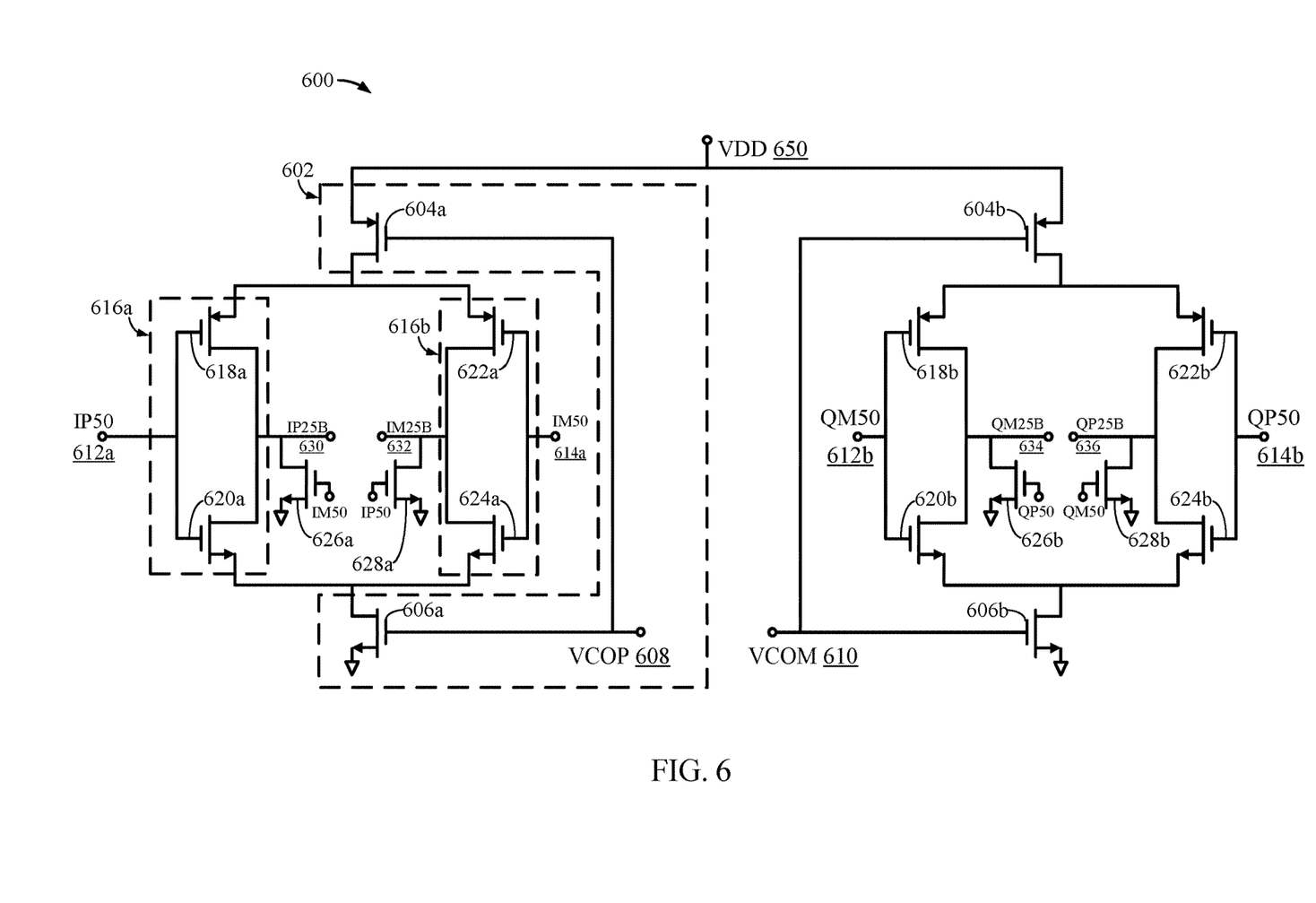
FIG. 6 is an example circuit diagram of the first oscillating circuit and the second oscillating circuit of FIG. 5, in accordance with certain aspects of the present disclosure.

FIG. 6 is an example circuit diagram 600 of the first oscillating circuit 400 of FIGS. 4 and 5, and the second oscillating circuit 510 of FIG. 5, illustrating additional detail.

A first inverter circuit 602 (e.g., first inverter circuit 402) includes a first switch 604a and a second switch 606a. In some configurations, the first switch 604a is a P-type metal-oxide-semiconductor logic (PMOS) switch, and the second switch 606a is an N-type metal-oxide-semiconductor logic (NMOS) switch. As illustrated, the first inverter circuit 602 receives power from a voltage source (VDD 650), and receives a positive voltage-controlled oscillator signal (VCOP 608) at the gates of each of the first switch 604a and the second switch 606a. In some examples, VCOP 608 is generated by the VCO tank 560 of FIG. 5 and provided to the first inverter circuit 602 via the VCO buffer 570.

The first inverter circuit 602 is configured to invert the VCOP signal 608 and pass the signal on to a first mixer 616a (e.g., first switch 406 of FIG. 4) and a second mixer 616b (e.g., second switch 408 of FIG. 4). The first mixer 616a includes a first passive switch 618a and a second passive switch 620a, each containing one or more resistors and/or diodes. The first passive switch 618a and the second passive switch 620a are configured to receive a frequency-divided signal (IPSO 612a), where IPSO 612a is a version of the VCOP 608 signal or a VCOM signal 610 frequency-divided by two. The first mixer 616a is configured to mix the VCOP 608 signal with the IPSO 612a signal to produce an LO signal (e.g., Lap 412 of FIG. 4) having a 25% duty cycle (e.g., IP25B 630).

The second mixer 616b is substantially similar to the first mixer 616a, and may contain the same or similar components. For example, the second mixer 616b includes a third passive switch 622a and a fourth passive switch 624a, each containing one or more resistors and/or diodes. The third passive switch 622a and the fourth passive switch 624a are configured to receive a frequency-divided signal (IM50 614a), where IM50 614a is a version of the VCOP 608 signal or a VCOM signal 610 frequency-divided by two. In some configurations, the IM50 614a signal may be an inverted version of the IPSO 612a signal. The second mixer 616b is configured to mix the VCOP 608 signal with the IM50 614a signal to produce an LO signal (e.g., Lam 416 of FIG. 4) having a 25% duty cycle (e.g., IM25B 632).

In some configurations, the first inverter circuit 602 receives VCOP 608, where VCOP 608 is a signal characterized by a frequency (e.g., $2f_{LO}$). The first inverter circuit 602 inverts VCOP 608 and communicates the inverted signal to the first mixer 616a and the second mixer 616b. The first mixer 616a mixes (multiplies) the inverted VCOP 608 signal with a frequency-divided VCOP 608 signal (e.g., $f_{LO}$). This generates IP25B 630 having the 25% duty cycle relative to the $f_{LO}$ frequency. Similarly, the second mixer 616b mixes (multiplies) the inverted VCOP 608 signal with a frequency-divided VCOP 608 signal (e.g., $f_{LO}$). In some configurations, the frequency-divided VCOP signal received by the second mixer 616b may be inverted relative to the frequency-divided VCOP signal received by the first mixer 616a. The second mixer 616b generates IM25B 632 having the 25% duty cycle relative to the $f_{LO}$ frequency. In some configurations, IM25B 632 is complementary to IP25B 630.

In some configurations, the first mixer 616a and the second mixer 616b each include an NMOS pull-down switch (626a and 628a). A first pull-down switch 626a includes a source terminal coupled to a ground, a drain terminal coupled to an output terminal of IP25B 630, and a gate terminal coupled to IM50 614a. A second pull-down switch 628a includes a source terminal coupled to a ground, a drain terminal coupled to an output terminal of IM25B 632, and a gate terminal coupled to IP50 612a.

The circuit diagram 600 also illustrates a second inverter circuit substantially similar to the first inverter circuit 602, including a third switch 604b and a fourth switch 606b. The second inverter circuit is configured to receive a negative VCO signal (VCOM 610) at the gates of each of the third switch 604b and the fourth switch 606b.

The circuit diagram 600 also illustrates a third mixer and a fourth mixer substantially similar to the first mixer 616a and the second mixer 616b. For example, the third mixer includes passive switches 618b and 620b configured to produce LO signal (e.g., $LO_{QP}$ 512) having a 25% duty cycle (e.g., QM25B 634). The fourth mixer includes passive switches 622b and 624b configured to produce LO signal (e.g., $LO_{Q}M$ 516) having a 25% duty cycle (e.g., QP25B 636).

The third mixer and the fourth mixer each include an NMOS pull-down switch (626b and 628b). A third pull-down switch 626b includes a source terminal coupled to a ground, a drain terminal coupled to an output terminal of QM25B 634, and a gate terminal coupled to QP50 614b. A fourth pull-down switch 628b includes a source terminal coupled to a ground, a drain terminal coupled to an output terminal of QP25B 636, and a gate terminal coupled to QM50 612b.

Figure 7:
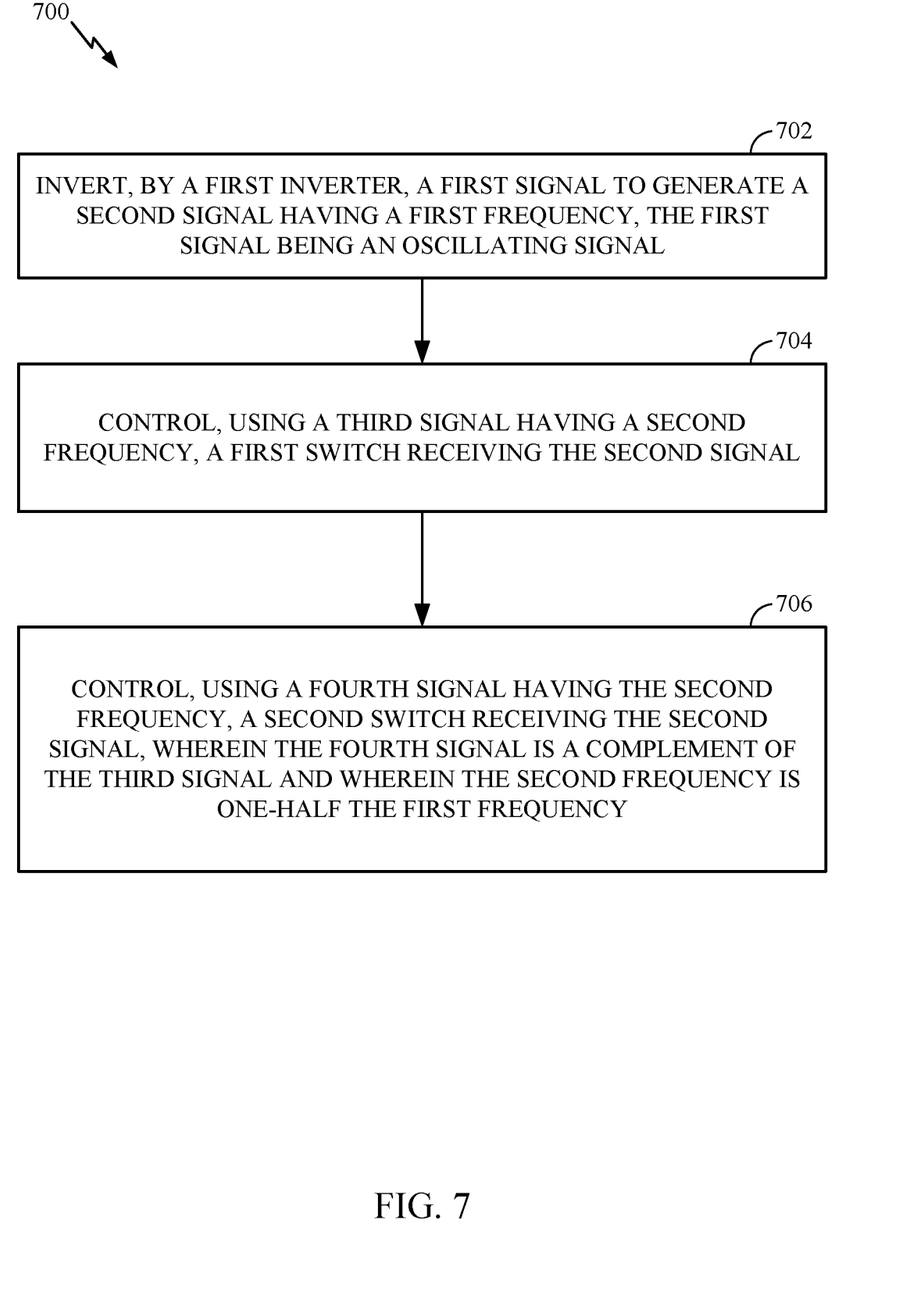
FIG. 7 is a flow diagram of example operations for generating a local oscillator (LO), in accordance with certain aspects of the present disclosure.

FIG. 7 is a flow diagram of example operations 700 for generating an LO signal, in accordance with certain aspects of the present disclosure. The operations 700 may be performed by an LO circuit, such as the circuits described with respect to FIGS. 4-6.

The operations 700 may begin, at block 702, by inverting, by a first inverter, a first signal to generate a second signal having a first frequency, the first signal being an oscillating signal. At block 704, the operations 700 proceed by controlling, using a third signal having a second frequency, a first switch receiving the second signal. At block 706, the operations 700 may proceed by controlling, using a fourth signal having the second frequency, a second switch receiving the second signal. The fourth signal may be a complement of the third signal. The second frequency may be one-half the first frequency.

In certain aspects, operations 700 may include generating, by a frequency dividing circuit, the third and fourth signals based on the first signal or the second signal.

In certain aspects, operations 700 may include outputting, by the first switch, a fifth signal having a first duty cycle, and outputting, by the second switch, a sixth signal having the first duty cycle, the fifth signal and the sixth signal being based on the second frequency.

In certain aspects, operations 700 may include inverting, by a second inverter, a fifth signal to generate a sixth signal having the first frequency, controlling, using a seventh signal having the second frequency, a third switch receiving the sixth signal, and controlling, using an eighth signal having the second frequency, a fourth switch receiving the sixth signal.

In certain aspects, the third signal and the fourth signal are generated by a frequency dividing circuit, the third signal and the fourth signal are generated based at least in part on the first signal, and the seventh signal and the eighth signal are generated by the frequency dividing circuit.

The circuits described herein and illustrated in FIGS. 4-6 allow for a reduced number of paths and circuits relative to conventional means. For example, the circuits illustrated and described herein utilize a single signal (e.g., $2f_{LO}$ 404a of FIG. 4) to produce two LO signals (e.g., $LO_{IP}$ 412 and $LO_{IM}$ 416 of FIG. 4). This reduces the amount of circuitry involved, thereby reducing noise in the generated LO signals. Moreover, the circuits illustrated and described herein reduce noise caused by modern transistors whose channel length has been reduced significantly (e.g., 16 nm to 7 nm) by reducing or eliminating flicker noise caused by shorter channel length.

ADDITIONAL CONSIDERATIONS

The various operations of methods described above may be performed by any suitable means capable of performing the corresponding functions. The means may include various hardware component(s) and/or module(s), including, but not limited to one or more circuits. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules, and circuits described in connection with the present disclosure may be implemented or performed with discrete hardware components designed to perform the functions described herein.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A local oscillator (LO) generation circuit comprising:
   a first oscillator circuit comprising:
      a first inverter;
      a first switch having a first terminal coupled to an output of the first inverter and a first control input configured to receive a first control signal; and
      a second switch having a second terminal coupled to the output of the first inverter and a second control input configured to receive a second control signal, the second control signal being a complement of the first control signal, wherein a first signal communicated from the output of the first inverter is characterized by a first frequency, wherein the first control signal and the second control signal comprise a second frequency, and wherein the first frequency is divisible by the second frequency.

2. The LO generation circuit of claim 1, wherein each of the first switch and the second switch is a passive switch.

3. The LO generation circuit of claim 1, wherein a second signal output by the second switch is characterized by the first frequency, and wherein the first signal is configured to have a reduced duty cycle relative to a third signal output from the first inverter.

4. The LO generation circuit of claim 1, wherein:
   the first switch is a first transistor, the first terminal is a drain of the first transistor, and the first control input is a gate of the first transistor; and
   the second switch is a second transistor, the second terminal is a drain of the second transistor, and the second control input is a gate of the second transistor.

5. The LO generation circuit of claim 1, wherein the first inverter comprises:
   a first transistor comprising a first drain and a first source, the first drain coupled to the first switch and the second switch, and the first source coupled to a first voltage source; and
   a second transistor comprising a second drain and a second source, the second drain coupled to the first switch and the second switch, and the second source coupled to a ground.

6. The LO generation circuit of claim 5, wherein the first transistor comprises a first gate coupled to a second voltage source, and wherein the second transistor comprises a second gate coupled to the second voltage source.

7. The LO generation circuit of claim 5, wherein the first switch comprises a third transistor and a fourth transistor, wherein the third transistor comprises a third source coupled to the first drain of the first transistor, and wherein the fourth transistor comprise a fourth source coupled to the second drain of the second transistor.

8. The LO generation circuit of claim 7, wherein the third transistor comprises a third drain coupled to a fourth drain of the fourth transistor, and wherein a fifth transistor comprises a fifth drain coupled to the third drain of the third transistor and the fourth drain of the fourth transistor.

9. The LO generation circuit of claim 8, wherein the fifth transistor comprises a pull-down n-channel metal-oxide-semiconductor (NMOS) transistor.

10. The LO generation circuit of claim 1, further comprising:
    a second oscillator circuit comprising:
       a second inverter;
       a third switch having a third terminal coupled to an output of the second inverter and a third control input configured to receive a third control signal; and
       a fourth switch having a fourth terminal coupled to the output of the second inverter and a fourth control input configured to receive a fourth control signal, the fourth control signal being a complement of the third control signal.

11. The LO generation circuit of claim 10, further comprising:
    a voltage-controlled oscillator (VCO) coupled to the first inverter and the second inverter; and
    a VCO buffer coupled between the VCO and the first inverter and the second inverter.

12. The LO generation circuit of claim 11, wherein the VCO buffer comprises a third inverter and a fourth inverter.

13. A method for local oscillator (LO) generation, comprising:
    inverting, by a first inverter, a first signal to generate a second signal having a first frequency, the first signal being an oscillating signal;
    controlling, using a third signal having a second frequency, a first switch receiving the second signal; and
    controlling, using a fourth signal having the second frequency, a second switch receiving the second signal, wherein the fourth signal is a complement of the third signal and wherein the second frequency is one-half the first frequency.

14. The method of claim 13, further comprising generating, by a frequency dividing circuit, the third and fourth signals based on the first signal or the second signal.

15. The method of claim 13, further comprising:
outputting, by the first switch, a fifth signal having a first duty cycle; and
outputting, by the second switch, a sixth signal having the first duty cycle, the fifth signal and the sixth signal being based on the second frequency.

16. The method of claim 13, further comprising:
inverting, by a second inverter, a fifth signal to generate a sixth signal having the first frequency;
controlling, using a seventh signal having the second frequency, a third switch receiving the sixth signal; and
controlling, using an eighth signal having the second frequency, a fourth switch receiving the sixth signal.

17. The method of claim 16, wherein:
the third signal and the fourth signal are generated by a frequency dividing circuit;
the third signal and the fourth signal are generated based at least in part on the first signal; and
the seventh signal and the eighth signal are generated by the frequency dividing circuit.

18. An apparatus for wireless communication, comprising:
means for inverting a first signal to generate a second signal having a first frequency, the first signal being an oscillating signal;
means for controlling, using a third signal having a second frequency, a first switch receiving the second signal; and
means for controlling, using a fourth signal having the second frequency, a second switch receiving the second signal, wherein the fourth signal is a complement of the third signal and wherein the second frequency is one-half the first frequency.

19. The apparatus of claim 18, further comprising means for generating the third and fourth signals based on the first signal or the second signal.

* * * * *